(12) United States Patent
Zhang et al.

(10) Patent No.: US 11,742,728 B2
(45) Date of Patent: Aug. 29, 2023

(54) ELECTRIC PUMP

(71) Applicant: Zhejiang Sanhua Intelligent Controls Co., Ltd., Zhejiang (CN)

(72) Inventors: Lulu Zhang, Zhejiang (CN); Hongmei Tian, Zhejiang (CN)

(73) Assignee: Zhejiang Sanhua Intelligent Controls Co., Ltd., Shaoxing (CN)

( * ) Notice: Subject to any disclaimer, the term of this patent is extended or adjusted under 35 U.S.C. 154(b) by 872 days.

(21) Appl. No.: 16/603,818

(22) PCT Filed: Sep. 11, 2018

(86) PCT No.: PCT/CN2018/104976
§ 371 (c)(1),
(2) Date: Oct. 8, 2019

(87) PCT Pub. No.: WO2019/128310
PCT Pub. Date: Jul. 1, 2019

(65) Prior Publication Data
US 2020/0119626 A1    Apr. 16, 2020

(30) Foreign Application Priority Data

Dec. 26, 2017 (CN) .......................... 201711435064.4
Dec. 26, 2017 (CN) .......................... 201721853901.0

(51) Int. Cl.
*H02K 11/33* (2016.01)
*H05K 1/18* (2006.01)
(Continued)

(52) U.S. Cl.
CPC .............. *H02K 11/33* (2016.01); *F04B 35/04* (2013.01); *F04B 39/06* (2013.01); *H02K 7/14* (2013.01);
(Continued)

(58) Field of Classification Search
CPC .......... H02K 7/14; H02K 11/33; F04B 35/04; F04B 17/03; F04B 39/06; H05K 1/0216;
(Continued)

(56) References Cited

U.S. PATENT DOCUMENTS

| | | | | |
|---|---|---|---|---|
| 4,356,532 A | * | 10/1982 | Donaher | ................ H05K 1/141 439/70 |
| RE31,929 E | * | 6/1985 | Donaher | .............. H05K 7/1092 439/70 |

(Continued)

FOREIGN PATENT DOCUMENTS

| | | |
|---|---|---|
| CN | 101005730 A | 7/2007 |
| CN | 103390891 A | 11/2013 |

(Continued)

OTHER PUBLICATIONS

Extended European Search Report for European Application No. 18894478.9 dated Aug. 18, 2021.
(Continued)

*Primary Examiner* — Alex W Mok
(74) *Attorney, Agent, or Firm* — Wolf, Greenfield & Sacks, P.C.

(57) ABSTRACT

An electric pump is provided. The electric pump includes a PCB board, where the PCB board is formed with a power input port. The electric pump further includes a common mode filter, where the common-mode filter includes a common mode inductor, and the common mode inductor is arranged close to the power input port; and in a direction perpendicular to a plane on which the PCB is located, no wiring is provided at the common mode inductor corresponding to a wiring film layer in the PCB.

15 Claims, 5 Drawing Sheets

(51) Int. Cl.
- *F04B 35/04* (2006.01)
- *H05K 1/11* (2006.01)
- *F04B 39/06* (2006.01)
- *H02K 7/14* (2006.01)

(52) U.S. Cl.
CPC ............. *H05K 1/111* (2013.01); *H05K 1/181* (2013.01); *H05K 2201/10166* (2013.01)

(58) Field of Classification Search
CPC .................. H05K 1/111; H05K 1/181; H05K 2201/10166; H05K 1/0233; H05K 2201/09027; H05K 2201/1006; H05K 1/0243; H02M 1/123; H02M 7/003
USPC ....................................................... 310/68 R
See application file for complete search history.

(56) References Cited

U.S. PATENT DOCUMENTS

| | | | | |
|---|---|---|---|---|
| 5,180,976 | A * | 1/1993 | Van Loan | G01R 1/0425 439/70 |
| 5,869,961 | A * | 2/1999 | Spinner | G01R 1/0408 439/607.09 |
| 7,301,781 | B2 * | 11/2007 | Konishi | H01L 24/73 257/E23.125 |
| 8,183,966 | B2 * | 5/2012 | Xu | H01F 27/2847 336/212 |
| 9,325,049 | B2 * | 4/2016 | Dai | H01P 3/04 |
| 9,704,857 | B2 * | 7/2017 | Kim | H01L 23/3128 |
| 2016/0182002 | A1 | 6/2016 | Nakamura et al. | |
| 2017/0303389 | A1 * | 10/2017 | Motohashi | H05K 5/0065 |

FOREIGN PATENT DOCUMENTS

| | | | | |
|---|---|---|---|---|
| CN | 204667394 | U | * | 9/2015 |
| CN | 105099165 | A | * | 11/2015 |
| CN | 205680373 | U | * | 11/2016 |
| CN | 106609739 | A | | 5/2017 |
| CN | 206237320 | U | * | 6/2017 |
| CN | 207603399 | U | | 7/2018 |
| EP | 2 953 254 | A1 | | 12/2015 |
| JP | 2013-007390 | A | | 1/2013 |
| JP | 2017191902 | A | * | 10/2017 ........... H05K 1/0215 |
| WO | WO-2016181835 | A1 | * | 11/2016 ........... H01F 17/062 |
| WO | WO-2017170818 | A1 | * | 10/2017 ........... H02M 1/143 |

OTHER PUBLICATIONS

International Search Report and Written Opinion for International Application No. PCT/CN2018/104976, dated Dec. 10, 2018.

* cited by examiner

ELECTRIC PUMP

CROSS-REFERENCE TO RELATED APPLICATIONS

This Application is a national stage filing under 35 U.S.C. 371 of International Patent Application Serial No. PCT/CN2018/104976, filed Sep. 11, 2018, which claims priority to Chinese Patent Application No. 201711435064.4, titled "ELECTRIC PUMP", filed on Dec. 26, 2017 and Chinese Patent Application No. 201721853901.0, title "ELECTRIC PUMP", filed on Dec. 26, 2017 with the Chinese Patent Office, both all of which are incorporated herein by reference in their entireties.

FIELD

The present disclosure relates to the technical field of electronic products, in particular to an electric pump.

BACKGROUND

Generally, a Printed Circuit Board (PCB) is applied in an electronic product to effectively control various kinds of parameters. For example, an electric pump is usually provided with the PCB to control all kinds of working parameters of a motor in the electric pump.

A power input port is generally arranged on the PCB to transmit a power signal to an electronic component on the PCB. However, an interference signal that may affect the power signal exits in the power signal transmitted via the power input port. The interference signal in the power signal may influence working performances of the electronic component on the PCB.

With increasing of the number of electronic components on the PCB, a technical problem to be solved urgently by those skilled in the art is how to arrange the electronic components on the PCB reasonably to improve electromagnetic compatibility of the PCB.

SUMMARY

In view of this, an electric pump is provided according to embodiments of the present disclosure. The electric pump is provided with a common mode filter. No wire is provided at a position in a wiring film layer in a PCB corresponding to a common mode inductor. Therefore, a common mode signal in a power signal transmitted through a power input port is filtered out. In addition, the common mode inductor in the common mode filter is arranged close to the power input port, thereby enhancing electromagnetic compatibility of the PCB and enhancing electromagnetic compatibility of the electric pump.

In an aspect, an electric pump is provided according to an embodiment of the present disclosure. The electric pump includes a stator assembly, a rotor assembly and a PCB. The stator assembly includes a coil. The rotor assembly includes a permanent magnet. The coil is electrically connected with the PCB. An excitation magnetic field is generated when the coil is energized. The rotor assembly rotates in the excited magnetic field. The PCB is provided with a power input port. The electric pump further includes a common mode filter including a common mode inductor. The common mode inductor is arranged close to the power input port. In a direction perpendicular to the PCB, no wire is provided at a position in a wiring film layer in the PCB corresponding to the common mode inductor.

The electric pump further includes a first filter. The first filter is arranged close to the common mode filter in a direction parallel to the PCB. A distance between the first filer and the power input port is greater than a distance between the common mode filter and the power input port. The first filter includes a first capacitor, a second capacitor and a differential mode inductor. The first capacitor and the second capacitor are connected in parallel, and are arranged at two sides of the differential mode inductor respectively.

The PCB is provided with a communication interface, and the electric pump further includes a TVS and a magnetic bead. The communication interface is electrically connected with both the TVS and the magnetic bead. The TVS is configured to absorb an interference signal in a communication signal transmitted via the communication interface, and the magnetic bead is configured to absorb an abnormal high-frequency signal in the communication signal transmitted via the communication interface.

The electric pump further includes a motor driving module including multiple thin film transistors. The multiple thin film transistors are arranged at a same side of the PCB. All of the thin film transistors in the motor driving module are intensively arranged in a first continuous region on the PCB in a direction parallel to the PCB, and an area of the first continuous region is greater than half of an area of the PCB.

The PCB is provided with a three-phase hole. All of the thin film transistors in the motor driving module are arranged close to the three-phase hole, and a ground wire electrically connected with the thin film transistors wraps a part of the PCB.

The electric pump further includes a sampling element and an integrated chip. A vertical projection of the sampling element on the PCB does not overlap with a vertical projection of the motor driving module on the PCB and a vertical projection of the integrated chip on the PCB. In a direction perpendicular to the PCB, wires are provided at positions in the wiring film layer in the PCB corresponding to the thin film transistors, the integrated chip and the sampling element. Two ends of the sampling element are electrically connected with corresponding terminals of the integrated chip through two wires of the wiring film layer in the PCB respectively, and the two wires have equal diameters and lengths.

The electric pump further includes a motor driving module and an integrated chip. The PCB includes two sides provided with electronic components. The motor driving module and the integrated chip are arranged at different sides of the PCB. A vertical projection of the motor driving module on the PCB does not overlap with a vertical projection of the integrated chip on the PCB.

In a direction parallel to the PCB, a heat dissipation region is provided between the motor driving module and the integrated chip. In a direction parallel to the PCB, the integrated chip is arranged closer to a geometrical center of the PCB than the motor driving module.

The electric pump further includes a motor driving module including multiple thin film transistors. The multiple thin film transistors are arranged at a same side of the PCB. Another side of the PCB that is provided with no thin film transistor is provided with a bare bonding pad corresponding to the thin film transistor. A vertical projection of the bonding pad on the PCB covers a vertical projection of the corresponding thin film transistor on the PCB, and a heat dissipation structure is provided on the bonding pad.

The electric pump further includes an integrated chip. A bare bonding pad is provided on a side of the PCB that is provided with no integrated chip. A vertical projection of the bonding pad on the PCB covers a vertical projection of the integrated chip on the PCB, and a heat dissipation structure is provided on the bonding pad.

According to the electric pump provided by embodiments of the present disclosure, the common mode filter is arranged in the electric pump, and thus useless signals, that is, common mode signals, in the power signals transmitted via the power input port are filtered out by the common mode filter. No wire is provided at a position in the wiring film layer in the PCB corresponding to the common mode inductor, thereby avoiding influencing the absorption of common-mode signals by the common mode filter. In addition, the common mode inductor in the common mode filter is arranged close to the power input port, thus the length of a wire laid from the common mode inductor to the power input port is reduced, thereby reducing difficulty of wiring, enhancing the electromagnetic compatibility of the PCB and thus enhancing the electromagnetic compatibility of the electric pump.

BRIEF DESCRIPTION OF THE DRAWINGS

In order to describe the technical solution in the embodiments of the present disclosure or the technical solution in the conventional technology clearer, drawings to be used in the embodiments of the present disclosure or in the conventional technology are briefly described hereinafter. It is apparent that the drawings described below show merely some embodiments of the present disclosure, and those skilled in the art may obtain other drawings according to the provided drawings without any creative effort.

DETAILED DESCRIPTION OF EMBODIMENTS

Figure 1:
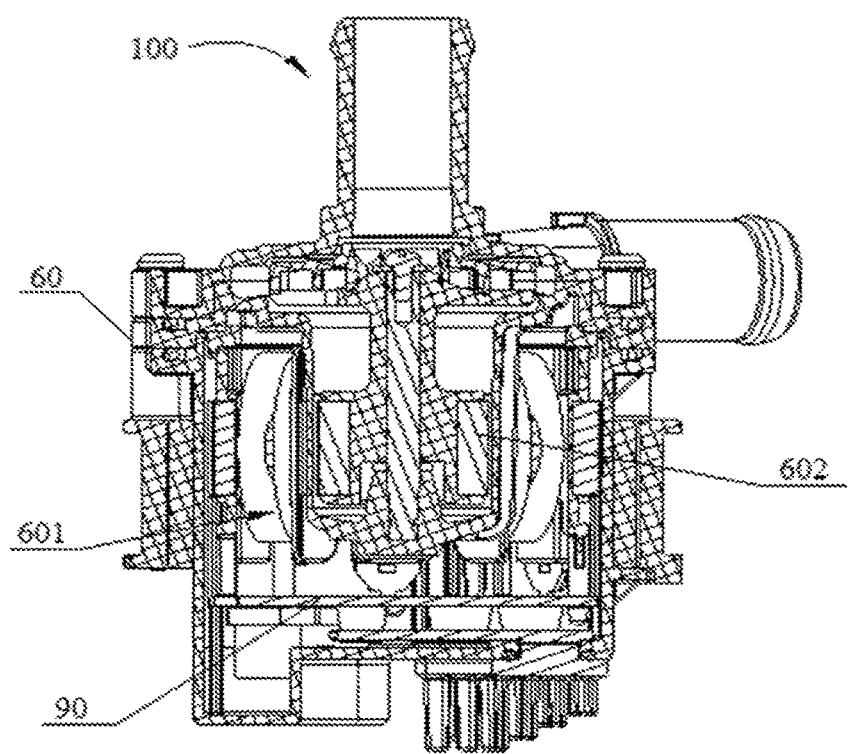
FIG. 1 is a schematic structural diagram of an electric pump according to an embodiment of the present disclosure.

To make objective, technical solutions and advantages of the present disclosure clearer, the technical solutions in the embodiments of the present disclosure are described clearly and completely in conjunction with the accompanying drawings in the embodiments of the present disclosure hereinafter. It is apparent that the below-described embodiments are merely some rather than all of embodiments of the present disclosure. All other embodiments obtained by those skilled in the art based on the embodiments in the present disclosure without any creative work should fall within the protection scope of the present disclosure.

An electric pump is provided according to an embodiment of the present disclosure. The electric pump includes a stator assembly, a rotor assembly and a PCB. The stator assembly includes a coil. The rotor assembly includes a permanent magnet. The coil is electrically connected with the PCB. An excitation magnetic field is generated when the coil is energized, and the rotor assembly rotates in the excitation magnetic field. A power input port is provided on the PCB. The electric pump further includes a common mode filter. The common mode filter includes a common mode inductor that is arranged close to the power input port in a direction perpendicular to the PCB. No wire is provided at a position in a wiring film layer in the PCB corresponding to the common mode inductor.

The power input port is usually arranged on the PCB to transmit a power signal to an electronic component on the PCB. However, an interference signal influencing the power signal exists in the power signal transmitted via the power input port. The interference signal in the power signal may affect working performances of the electronic component on the PCB. With increasing of the number of electronic components on the PCB, a technical problem to be solved urgently by those skilled in the art is how to arrange the electronic components on the PCB reasonably to improve electromagnetic compatibility of the PCB.

The electric pump provided according to embodiments of the present disclosure includes a common mode filter that can filter out useless signals, that is, common-mode signals, in the power signal transmitted via the power input port. No wire is provided at a position in the wiring film layer in the PCB corresponding to the common mode inductor, thereby avoiding influencing the absorption of common mode signals by the common mode filter. In addition, the common mode inductor in the common mode filter is arranged close to the power input port, and thus the length of a wire laid from the common mode inductor to the power input port is reduced, thereby reducing difficulty of wiring, enhancing the electromagnetic compatibility of the PCB, and thus enhancing the electromagnetic compatibility of the electric pump.

The concept of the present disclosure is described above, and the technical solutions in the embodiments of the present disclosure are described clearly and completely in conjunction with the accompanying drawings in the embodiments of the present disclosure hereinafter. All other embodiments obtained by those skilled in the art based on the embodiments in the present disclosure without any creative work should fall within the protection scope of the present disclosure.

FIG. 1 is a schematic structural diagram of an electric pump according to an embodiment of the present disclosure. As shown in FIG. 1, the electric pump 100 includes a housing 60, a stator assembly 601, a rotor assembly 602 and a PCB 90. The stator assembly 601, the rotor assembly 602 and the PCB 90 are accommodated in a cavity formed by the housing 60. The stator assembly 601 includes a coil. The rotor assembly 602 includes a permanent magnet. The coil is electrically connected with the PCB 90. An excitation magnetic field is generated when the coil is energized, and the rotor assembly 602 rotates in the excitation magnetic field.

Figure 2:
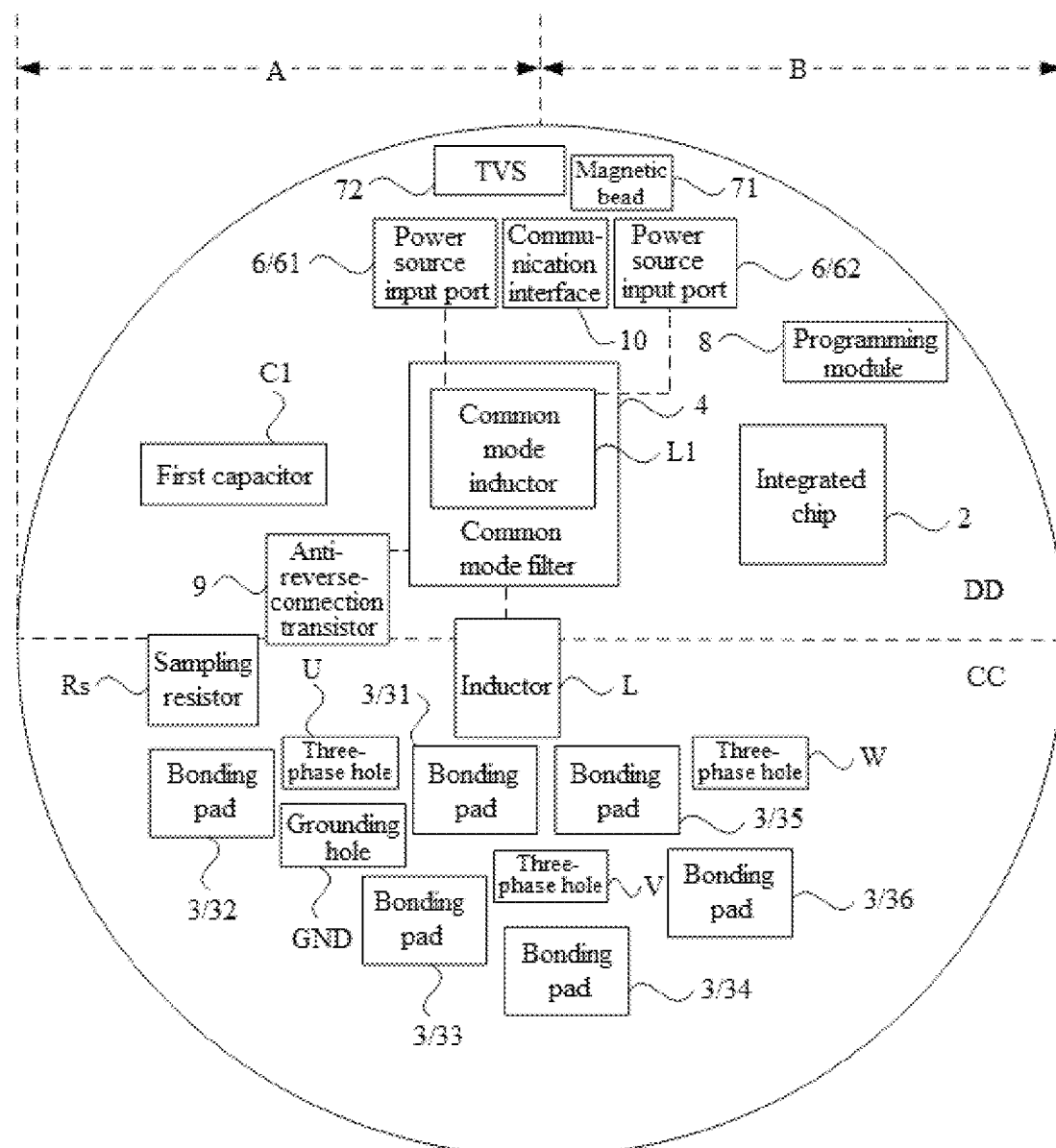
FIG. 2 is a schematic structural diagram of a side of a PCB according to an embodiment of the present disclosure.
Figure 3:
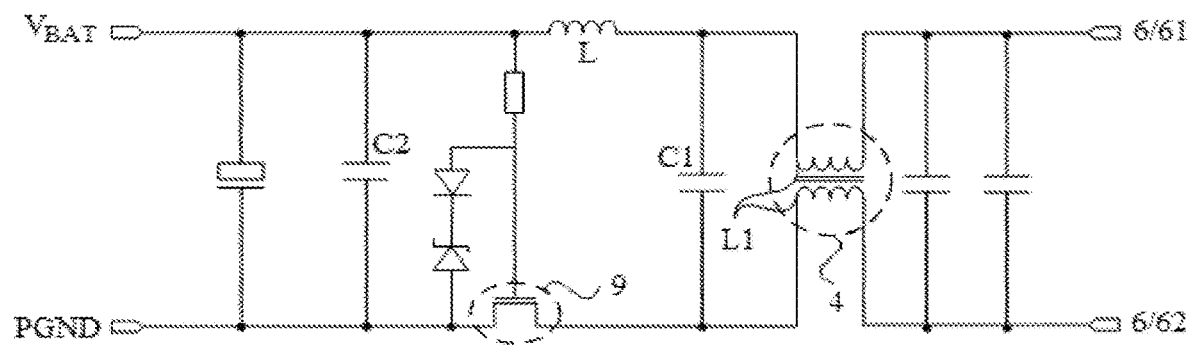
FIG. 3 is a schematic diagram showing a circuit connection relationship of electronic components on a PCB according to an embodiment of the present disclosure.

FIG. 2 is a schematic structural diagram of a side of a PCB according to an embodiment of the present disclosure. FIG. 3 is a schematic diagram showing a circuit connection relationship of electronic components on a PCB according to an embodiment of the present disclosure. Referring to FIG. 2 and FIG. 3, a power input port 6 is provided on the PCB. The electric pump further includes a common mode filter 4. The common mode filter 4 includes a common mode inductor L1. The common mode inductor L1 is arranged close to the power input port 6 in a direction perpendicular to the PCB. No wire is provided at a position in a wiring film layer in the PCB corresponding to the common mode inductor L1.

Referring to FIG. 2 and FIG. 3, the electric pump may include a power supply module configured to supply a power signal to each electronic component on the PCB via the power input port. The power supply module may be arranged on the PCB through a power input port 61 and a power input port 62 on the PCB. The power input port 61 may be electrically connected with a positive terminal of the power supply module. The power input port 62 may be electrically connected with a negative terminal of the power supply module.

Referring to a circuit connection relationship of the common mode filter 4 and the power input port 6 as shown in FIG. 3, a common mode signal in a power signal transmitted via the power input port 6 is useless. The common mode filter 4 can filter out the common mode signal in the power signal transmitted via the power input port 6. The power signal transmitted via the power input port 6 firstly passes through the common mode filter 4, thus the common mode inductor L1 is arranged close to the power input port 6. The word "close" here is relative. For example, referring to FIG. 2, the common mode inductor L1, compared with the motor driving module 1, is arranged closer to the power input ports 61 and 62 on the PCB. In this case, a length of a wire laid from the common mode inductor L1 to the power input port 6 is reduced, thereby reducing difficulty of wiring, enhancing electromagnetic compatibility of the PCB, and thus enhancing electromagnetic compatibility of the electric pump. In addition, wires arranged at the position in the wiring film layer in the PCB corresponding to the common mode inductor L1 may affect absorbing the common mode signal by the common mode filter 4, in a direction perpendicular to the PCB. Therefore, in the direction perpendicular to the PCB, no wire is provided in the position in the wiring film layer in the PCB corresponding to the common mode inductor L1 according to the present disclosure, thereby ensuring that the common mode signal is filtered out effectively by the common mode filter 4.

Figure 4:
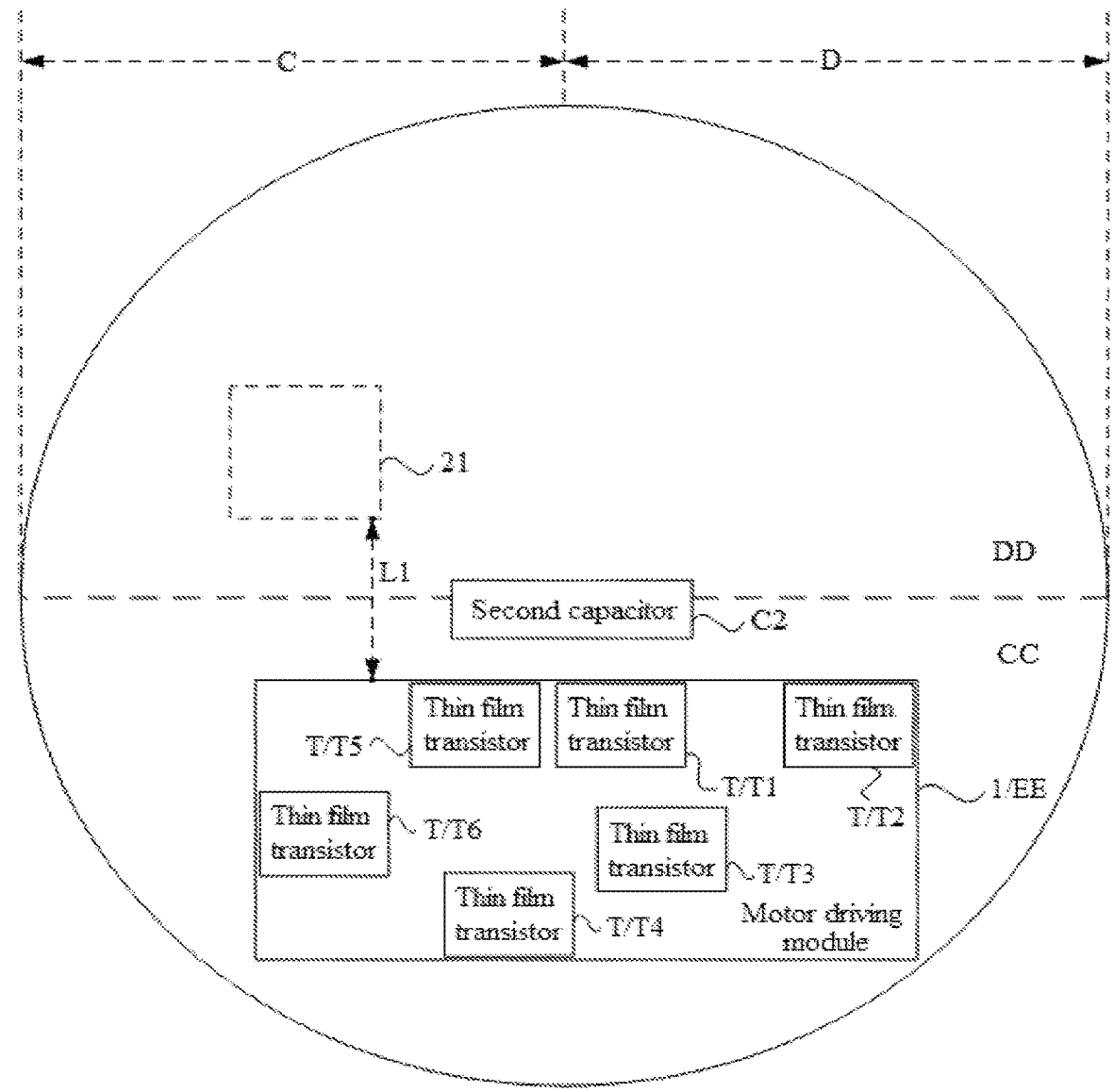
FIG. 4 is a schematic structural diagram of another side of a PCB according to an embodiment of the present disclosure.

FIG. 4 is a schematic structural diagram of another side of a PCB according to an embodiment of the present disclosure. It should be noted that, a structure of a side of the PCB as shown in FIG. 2 is opposite to a structure of another side of the PCB as show in FIG. 4, that is, the structure of the PCB as shown in FIG. 4 is obtained by reversing the structure of the PCB as shown in FIG. 2 along a vertical symmetry axis. A region A in FIG. 2 corresponds to a region D in FIG. 4, and a region B in FIG. 2 corresponds to a region C in FIG. 4.

Referring to FIG. 2, FIG. 3 and FIG. 4, the PCB may further include a first filter. The first filter may be a π-filter. The first filter may include a first capacitor C1, a second capacitor C2 and a differential mode inductor L. The first capacitor C1, the second capacitor C2 and the differential mode inductor L are arranged in a shape of character "π". The first capacitor C1 and the second capacitor C2 may be in parallel connection, and the first capacitor C1 and the second capacitor C2 each are provided with the differential mode inductor L. That is, a vertical projection of the first capacitor C1 on the PCB and a vertical projection of the second capacitor C2 on the PCB are covered by a vertical projection of the differential mode inductor L on the PCB. The first capacitor C1, the second capacitor C2 and the differential mode inductor L may be located at different sides of the PCB, or may be located at a same side of the PCB.

Referring to a circuit connection relationship of the first filter, the common mode filter 4 and the power input port 6 as shown in FIG. 3, the first filter may be arranged close to the common mode filter 4 in a direction parallel to the PCB. A distance between the first filter and the power input port 6 is greater than a distance between the common mode filter 4 and the power input port 6. The first capacitor C1, the second capacitor C2 and the differential mode inductor L are arranged close to the common mode filter 4 in a direction parallel to the PCB. Thus, a distance between the power input port 6 and each of the first capacitor C1, the second capacitor C2 and the differential mode inductor L is greater than the distance between the common mode filter 4 and the power input port 6. The first filter can suppress a low-frequency conduction signal in the power signal outputted by the power supply module via the power input port 6 and the common mode filter 4. By arranging the first filter close to the common mode filter 4, the electromagnetic compatibility of the PCB can be increased effectively. The PCB may be further provided with an anti-reverse-connection thin film transistor 9. The anti-reverse-connection thin film transistor 9 may be arranged close to the first filter.

Figure 5:
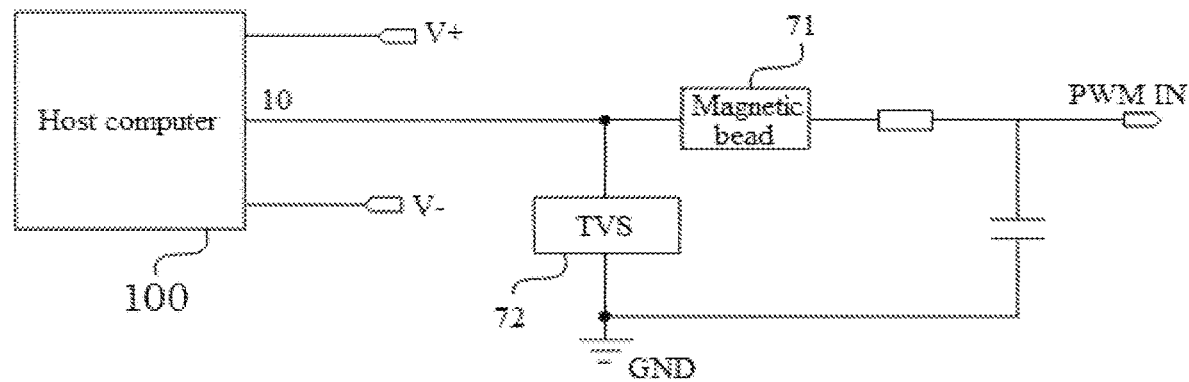
FIG. 5 is a schematic diagram showing a circuit connection relationship of a communication interface, a TVS and a magnetic bead according to an embodiment of the present disclosure.

The PCB may be further provided with a communication interface. The electric pump may further include a Transient Voltage Suppressor (TVS) and a magnetic bead. FIG. 5 is a schematic diagram showing a circuit connection relationship of a communication interface, a TVS and a magnetic bead according to an embodiment of the present disclosure. Referring to FIG. 2, FIG. 4 and FIG. 5, a communication interface 10 is electrically connected with a TVS 72 and a magnetic bead 71. The TVS 72 is configured to absorb an interference signal in a communication signal transmitted via the communication interface 10. The magnetic bead 71 is configured to absorb an abnormal high-frequency signal in the communication signal transmitted via the communication interface 10.

Schematically, the communication signal sent by a host computer 100 and transmitted via the communication interface 10 passes through the TVS 72 and the magnetic bead 71. The TVS 72 absorbs the interference signal in the communication signal. The magnetic bead 71 absorbs the abnormal high-frequency signal in the communication signal. Therefore, transmission of the interference signal is suppressed. In an embodiment, the magnetic bead 71 and the TVS 72 are arranged close to the communication interface 10, to improve the electromagnetic compatibility of the PCB.

Figure 6:
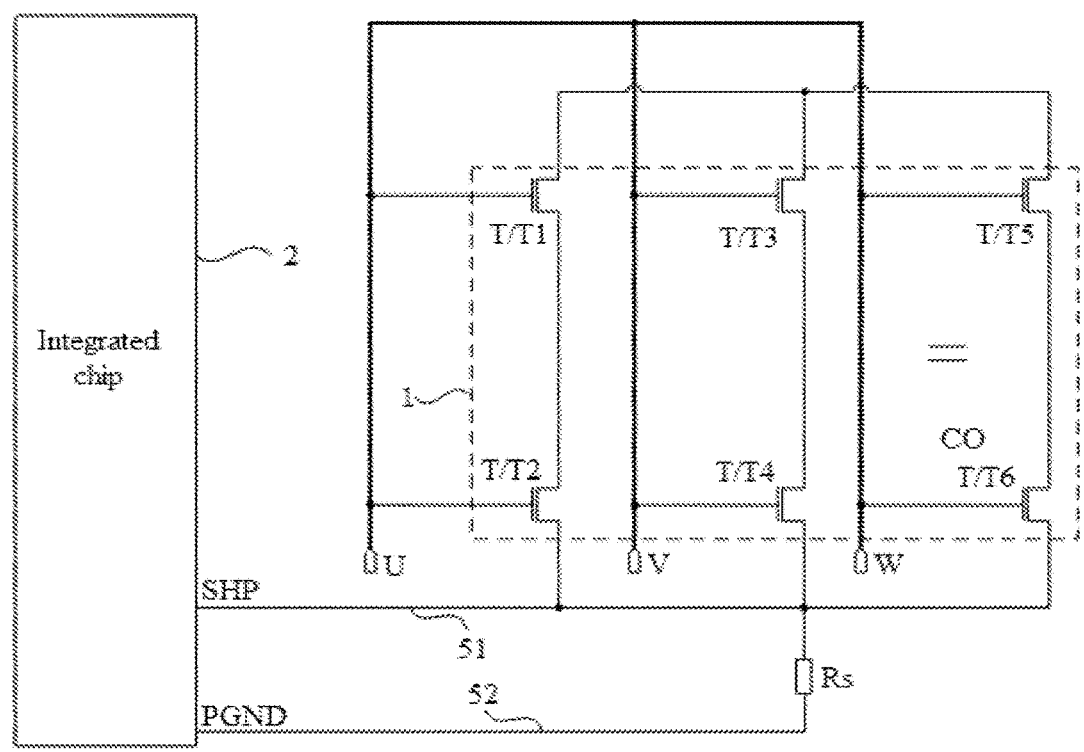
FIG. 6 is a schematic diagram showing a circuit connection relationship of a motor driving module according to an embodiment of the present disclosure.

As shown in FIG. 4, the electric pump may include a motor driving module 1. FIG. 6 is a schematic diagram showing a circuit connection relationship of a motor driving module according to an embodiment of the present disclosure. Referring to FIG. 4 and FIG. 6, the motor driving module 1 includes multiple thin film transistors T. All thin film transistors T in the motor driving module 1 are intensively arranged in a first continuous region EE on the PCB in a direction parallel to the PCB. An area of the first continuous region EE is smaller than half of an area of the PCB. Schematically, the motor driving module 1 may be a three-phase bridge circuit. The motor driving module 1 includes six thin film transistors T. Two of the thin film transistors T form a branch of the motor driving module 1. For example, a thin film transistor T1 and a thin film transistor T2 form a branch, a thin film transistor T3 and a thin film transistor T4 form a branch, and a thin film transistor T5 and a thin film transistor T6 form a branch, that is, there are three branches in total. All thin film transistors T in the motor driving module 1 are intensively arranged in the first continuous region EE on the PCB, in the direction parallel to the PCB. In addition, the area of the first continuous region EE is smaller than half of the area of the PCB, so that the six thin film transistors T in the motor driving module 1 are arranged intensively and close to each other, thereby reducing lengths of a power line and a ground wire of the motor driving module 1, and thus effectively decreasing electromagnetic radiation interference.

Referring to FIG. 2, FIG. 4 and FIG. 6, three-phase holes U, V and W are provided on the PCB. All thin film transistors T in the motor driving module 1 are arranged close to the three-phase holes U, V and W. A ground wire electrically connected with the thin film transistor T wraps a part of the PCB. The two thin film transistors T of each branch may be arranged close to a corresponding three-phase hole. In this way, a length of a wire connecting the thin film transistor T to the corresponding three-phase hole is reduced, and electromagnetic compatibility of the PCB is enhanced. For example, the thin film transistor T1 and the thin film transistor T2 are arranged close to the three-phase hole U, the thin film transistor T3 and the thin film transistor T4 are arranged close to the three-phase hole V, and the thin film transistor T5 and the thin film transistor T6 are arranged close to the three-phase hole W. The three-phase holes U, V, W and a grounding hole GND are arranged intensively, thereby preventing increasing the difficulty of wiring and influencing the electromagnetic compatibility of the PCB due to excessive dispersion of welding holes. When arranging the thin film transistor of the motor driving module 1 on the PCB, a power supply terminal of the thin film transistor may be arranged to be away from an edge of the PCB, and a grounding terminal of the thin film transistor may be arranged close to the edge of the PCB. In this way, the ground wire electrically connected with the thin film transistor T can wrap a large-area line in the PCB, thereby enhancing the electromagnetic compatibility of the PCB.

Referring to FIG. 2 and FIG. 4, the PCB may further include a sampling element Rs and an integrated chip 2. The sampling element Rs and the integrated chip 2 are arranged, so that a vertical projection of the sampling element Rs on the PCB does not overlap with a vertical projection of the motor driving module 1 on the PCB and a vertical projection of the integrated chip 2 on the PCB. Current flowing through the thin film transistors T of the motor driving module 1 flows through the sampling element Rs. When a large current flows through the sampling element Rs, a temperature of the sampling element Rs rises significantly. Compared with the solution that the vertical projection of the sampling element Rs on the PCB partially overlaps with the vertical projection of the motor driving module 1 on the PCB or the vertical projection of the integrated chip 2 on the PCB, it is beneficial to dissipate heat of the sampling element Rs, the integrated chip 2 and the motor driving module 1 by adopting the solution that the vertical projection of the sampling element Rs on the PCB does not overlap with either of the vertical projection of the motor driving module 1 on the PCB and the vertical projection of the integrated chip 2 on the PCB. Therefore, the problem that the performance of the PCB is severely affected due to the temperature rise of the sampling element Rs, the integrated chip 2 and the motor driving module 1 is alleviated. Schematically, the sampling element Rs and the integrated chip 2 are arranged at a same side of the PCB.

In a direction perpendicular to the PCB, wires are provided at positions in the wiring film layer in the PCB corresponding to the thin film transistor T, the integrated chip 2 and the sampling element Rs. The PCB may be a multi-layer board including two film layers located at outermost sides and multiple wiring film layers located in the middle. The two film layers are configured arrange an electronic component. The multiple wiring film layers are configured to connect wires of the electronic components. For the motor driving module 1, the integrated chip 2 and the sampling element Rs having significant temperature rise, metal wires are provided at positions in the wiring film layer in the PCB corresponding to the thin film transistor T, the integrated chip 2 and the sampling element Rs of the motor driving module 1, thereby being beneficial to dissipate heat of the thin film transistor T, the integrated chip 2 and the sampling element Rs of the motor driving module 1. Further, a width of the metal wires arranged at the positions in the wiring film layer in the PCB corresponding to the thin film transistor T, the integrated chip 2 and the sampling element Rs of the motor driving module 1 may be increased, thereby improving the heat dissipation of the thin film transistor T, the integrated chip 2 and the sampling element Rs of the motor driving module 1 and alleviating the problem that the performance of the PCB is severely affected due to the temperature rise of the sampling element Rs, the integrated chip 2 and the motor driving module 1.

As shown in FIG. 6, two ends of a sampling resistor Rs are electrically connected with corresponding terminals of the integrated chip 2 through a wire 51 and a wire 52 located in the wiring film layer of the PCB respectively. That is, one end of the sampling resistor Rs is electrically connected with a terminal SHP of the integrated chip 2 through the wire 51. Another end of the sampling resistor Rs is electrically connected with a terminal PGND of the integrated chip 2 through the wire 52. The wire 51 and the wire 52 may have equal diameters and lengths. Current flowing through the sampling resistor Rs is current flowing through the coil of the motor. Driving current flowing through the coil of the motor may be measured by collecting the current flowing through the sampling resistor Rs. Since the diameters and the lengths of the wire 51 and the wire 52 electrically connected with the sampling resistor Rs are the same, a resistance of the wire 51 is the same as a resistance of the wire 52, thereby increasing accuracy of the collected driving current of the motor.

Referring to FIG. 2 and FIG. 4, the electric pump may further include a motor driving module 1 and an integrated chip 2. The PCB includes two sides provided with electronic components. FIG. 2 and FIG. 4 respectively show the two sides of the PCB provided with the electronic components. In which, the motor driving module 1 and the integrated chip 2 are arranged at different sides of the PCB, and a vertical projection of the motor driving module 1 on the PCB does not overlap with a vertical projection of the integrated chip 2 on the PCB. The vertical projection 21 of the motor driving module 1 on the PCB is shown illustratively in FIG. 4. It can be seen that, the motor driving module 1 and the integrated chip 2 are arranged at different sides of the PCB, and the vertical projection of the motor driving module 1 on the PCB does not overlap with the vertical projection of the integrated chip 2 on the PCB.

The motor driving module 1 may supply driving current to the motor, to drive the motor to rotate. The integrated chip 2 is configured to provide a control signal for the electronic components on the PCB such as the motor driving module 1. The PCB includes multiple film layers that are stacked. The film layers arranged at two sides are configured to accommodate an electronic component for controlling the motor to rotate. The motor driving module 1 and the integrated chip 2 have a significant temperature rise when the current passes through. Compared with the solution that the motor driving module 1 and the integrated chip 2 are arranged at a same side of the PCB, it is beneficial to dissipate heat of the motor driving module 1 and the integrated chip 2 by adopting the solution that the motor driving module 1 and the integrated chip 2 are arranged at different sides of the PCB.

Referring to FIG. 2 and FIG. 4, the vertical projection of the motor driving module 1 on the PCB does not overlap with the vertical projection of the integrated chip 2 on the PCB. Compared with the solution that the vertical projection of the motor driving module 1 on the PCB partially overlaps with the vertical projection of the integrated chip 2 on the PCB, a distance between the motor driving module 1 and the integrated chip 2 is increased in a direction parallel to the PCB, thereby being beneficial to heat dissipation of the motor driving module 1 and the integrated chip 2, and thus alleviating the problem that the performance of the PCB is severely affected due to the temperature rise of the motor driving module 1 and the integrated chip 2.

Referring to FIG. 2 and FIG. 4, a heat dissipation region is provided between the motor driving module 1 and the integrated chip 2 (the integrated chip 2 is schematically represented by the vertical projection of the integrated chip 2 on the PCB herein) in a direction parallel to the PCB. It should be noted that, a shape of the heat dissipation region is not limited in the present disclosure. The heat dissipation region may have a regular shape, or an irregular shape. In a direction parallel to the PCB, the integrated chip 2 may be arranged closer to a geometric center of the PCB than the motor driving module 1. The PCB generally has a regular shape. For example, if the PCB has a circular shape, the geometric center of the PCB is a center of the circle. If the PCB has a rectangular shape, the geometric center of the PCB is an intersection point of two diagonal lines of the rectangle. If the PCB has an orthohexagonal shape, the geometric center of the PCB is an intersection point of diagonal lines of the regular hexagon. The integrated chip 2 is arranged closer to the geometric center of the PCB than the motor driving module 1, thereby avoiding influencing the performance of the integrated chip due to static electricity in an edge region of the PCB.

Referring to FIG. 2 and FIG. 4, a maximum distance between two points in the heat dissipation region in a direction parallel to the PCB, that is, a distance L1 between the motor driving module 1 and a point of the integrated chip 2 that is nearest to the motor driving module 1 in the direction parallel to the PCB, may be greater than or equal to 10 mm, and less than or equal to 58 mm. If the maximum distance between two points in the heat dissipation region in a direction parallel to the PCB is excessively small, a distance between the integrated chip 2 and the motor driving module 1 with significant temperature rise is excessively small. In this case, it is not beneficial to the heat dissipation of the motor driving module 1 and the integrated chip 2, resulting in the problem that the performance of the PCB is severely affected due to the temperature rise of the motor driving module 1 and the integrated chip 2. Further, the maximum distance between two points in the heat dissipation region in a direction parallel to the PCB cannot be too great, in consideration of limitation of a size of the PCB.

Referring to FIG. 2 and FIG. 4, the PCB may be arranged to have a circular shape for example. In a diameter direction of the PCB, schematically, in a horizontal diameter direction of the PCB, the PCB includes a first semi-circle region CC and a second semi-circle region DD. The motor driving module 1 is located in the first semi-circle region CC, and the integrated chip 2 is located in the second semi-circle region DD. The motor driving module 1 and the integrated chip 2 are located at different sides of the PCB. The PCB may have a rectangular shape. In a direction along a symmetry axis of the PCB, the PCB includes a first rectangular region and a second rectangular region. The motor driving module may be located in the first rectangular region and the integrated chip may be located in the second rectangular region. The integrated chip and the motor driving module are located at different sides of the PCB. The shape of the PCB is not limited in embodiments of the present disclosure.

Referring to FIG. 2 and FIG. 4, the motor driving module 1 may include multiple thin film transistors T, for example, six thin film transistors T1 to T6 shown herein. The multiple thin film transistors T are arranged at a same side of the PCB. Another side of the PCB that is arranged with no thin film transistor T is provided with a bare bonding pad 3 corresponding to the thin film transistors T. Schematically, there is a one-to-one correspondence between the bonding pads 3 and the thin film transistors T, and a vertical projection of the bonding pad 3 on the PCB covers a vertical projection of the corresponding thin film transistor T on the PCB. For example, there is a one-to-one correspondence between the thin film transistors T1 to T6 and the bonding pads 31 to 36. That is, vertical projections of the bonding pads 31 to 36 on the PCB respectively cover vertical projections of the corresponding thin film transistors T1 to T6 on the PCB. The thin film transistor T is a main electronic component to form the motor driving module 1, thus the heat dissipation effect of the thin film transistor T determines the heat dissipation effect of the motor driving module 1. The bare bonding pad 3 is obtained by removing a rosin material that wraps the bonding pad 3 in the PCB, to expose the bonding pad 3 of a metal material. The bare bonding pads 3 having one-to-one correspondence with the thin film transistors T are arranged at another side of the PCB provided with no thin film transistor T, and the vertical projection of the bonding pad 3 on the PCB covers the vertical projection of the corresponding thin film transistor T on the PCB, thereby being beneficial to dissipate the heat of the thin film transistor T in the motor driving module 1 with the significant temperature rise, and thus alleviating the problem that the performance of the PCB is severely affected due to the temperature rise of the motor driving module 1.

A side of the PCB that is provided with no integrated chip 2 may be provided with a bare bonding pad. That is, the bare bonding pad (not shown in FIG. 4) is arranged in the corresponding projection region 21, and a vertical projection of the bare bonding pad on the PCB covers a vertical projection of the integrated chip 2 on the PCB. The bare bonding pad is arranged at the side of the PCB that is provided with no integrated chip 2, and the vertical projection of the bonding pad on the PCB covers the vertical projection of the integrated chip 2 on the PCB, thereby being beneficial to the heat dissipation of the integrated chip 2 with significant temperature rise, and thus alleviating the problem that the performance of the PCB is severely affected due to the temperature rise of the integrated chip 2.

The bare bonding pad may be provided with a heat dissipation structure. That is, a heat dissipation structure may be provided on the bare bonding pad corresponding to the thin film transistor in the corresponding motor driving module, or may be provided on the bare bonding pad corresponding to the integrated chip, thereby being beneficial to heat dissipation of the motor driving module and the integrated chip with the significant temperature rise. The heat dissipation structure may be a thermal conductive adhesive, a thermal conductive silicone grease or a cooling fin. If the PCB is configured to control a motor of a water pump to rotate, the heat dissipation structure may be a thermal conductive adhesive. If the PCB is configured to control a motor of an oil pump to rotate, the heat dissipation structure may be a thermal conductive silicone grease.

Referring to FIG. 2 and FIG. 4, the electric pump may further include a programming module 8 configured to input a to-be-debugged downloaded program to the integrated chip 2. The programming module 8 may be arranged to be close to the integrated chip 2, thereby facilitating programming. A programming module of a bonding pad type may be applied rather than a programming module 8 of a patch pin type, since the programming module 8 of the patch pin type may conduct an electric arc to the integrated chip 2, resulting in burning of the integrated chip 2.

Around the integrated chip, electronic components such as a capacitor, a resistor, and a diode may be arranged. The electronic components such as the capacitor, the resistor, and the diode may be arranged close to a corresponding terminal of the integrated chip, thereby reducing a length of the connecting wire and improving the electromagnetic compatibility of the PCB.

The electric pump provided according to embodiments of the present disclosure includes a common mode filter that can filter out useless signals, that is, common mode signals, in the power signal transmitted via the power input port. No wire is provided at the position in the wiring film layer in the PCB corresponding to the common mode inductor, thereby effectively avoiding influencing the absorption of common mode signals by the common mode filter 4. In addition, the common mode inductor in the common mode filter is arranged to be close to the power input port, thus the length of the wire laid from the common mode inductor to the power input port is reduced, thereby reducing the difficulty of wiring, enhancing the electromagnetic compatibility of the PCB and thus enhancing the electromagnetic compatibility of the electric pump.

Only preferred embodiments and technical principles of the present disclosure are described above. It should be understood by those skilled in the art that the present disclosure is not limited by the particular embodiments herein. Various changes, adjustments and replacements can be made to the present disclosure by those skilled in the art without departing from the protection scope of the present disclosure. The present disclosure is described in detail by the above embodiments, but the present disclosure is not limited by the above embodiments. More equivalent embodiments may be obtained without departing from the concept of the present disclosure. The scope of the present disclosure is defined by the attached claims.

The invention claimed is:

1. An electric pump, comprising:
a stator assembly;
a rotor assembly; and
a PCB, wherein
the stator assembly comprises a coil, the rotor assembly comprises a permanent magnet, the coil is electrically connected with the PCB, an excitation magnetic field is generated when the coil is energized, and the rotor assembly rotates in the excitation magnetic field;
the PCB is provided with a power input port, the electric pump further comprises a common mode filter, the common mode filter comprises a common mode inductor arranged close to the power input port; and
in a direction perpendicular to the PCB, no wire is provided at a position in a wiring film layer in the PCB corresponding to the common mode inductor.

2. The electric pump according to claim 1, further comprising:
a first filter arranged close to the common mode filter in a direction parallel to the PCB, wherein a distance between the first filter and the power input port is greater than a distance between the common mode filter and the power input port;
and wherein the first filter comprises a first capacitor, a second capacitor and a differential mode inductor, and the second capacitor is connected in series with the differential mode inductor and is connected in parallel to the first capacitor.

3. The electric pump according to claim 2, wherein the PCB is provided with a communication interface; the electric pump comprises a TVS and a magnetic bead;
the communication interface is electrically connected with both the TVS and the magnetic bead, the TVS is configured to absorb an interference signal in a communication signal transmitted via the communication interface, and the magnetic bead is configured to absorb an abnormal high- frequency signal in the communication signal transmitted via the communication interface.

4. The electric pump according to claim 2, further comprising: a motor driving module,
wherein the motor driving module comprises a plurality of thin film transistors arranged at a same side of the PCB, all the thin film transistors in the motor driving module are intensively arranged in a first continuous region on the PCB in a direction parallel to the PCB, and an area of the first continuous region is smaller than half of an area of the PCB.

5. The electric pump according to claim 2, further comprising a motor driving module and an integrated chip,
wherein the PCB comprises two sides provided with electronic components, the motor driving module and the integrated chip are arranged at different sides of the PCB, and a vertical projection of the motor driving module on the PCB does not overlap with a vertical projection of the integrated chip on the PCB.

6. The electric pump according to claim 2, further comprising a motor driving module,
wherein the motor driving module comprises a plurality of thin film transistors arranged at a same side of the PCB; another side of the PCB that is provided with no thin film transistor is provided with a bare bonding pad corresponding to the thin film transistor; a vertical projection of the bonding pad on the PCB covers a vertical projection of the corresponding thin film transistor on the PCB, and a heat dissipation structure is provided on the bonding pad.

7. The electric pump according to claim 2, further comprising an integrated chip, wherein a bare bonding pad is provided on a side of the PCB that is provided with no integrated chip; a vertical projection of the bonding pad on the PCB covers a vertical projection of the corresponding integrated chip on the PCB, and a heat dissipation structure is provided on the bonding pad.

8. The electric pump according to claim 1, wherein the PCB is provided with a communication interface; the electric pump comprises a TVS and a magnetic bead;
the communication interface is electrically connected with both the TVS and the magnetic bead, the TVS is configured to absorb an interference signal in a communication signal transmitted via the communication interface, and the magnetic bead is configured to absorb an abnormal high- frequency signal in the communication signal transmitted via the communication interface.

9. The electric pump according to claim 1, further comprising: a motor driving module,
wherein the motor driving module comprises a plurality of thin film transistors arranged at a same side of the PCB, all the thin film transistors in the motor driving module are intensively arranged in a first continuous region on the PCB in a direction parallel to the PCB, and an area of the first continuous region is smaller than half of an area of the PCB.

10. The electric pump according to claim 9, wherein the PCB is provided with a three-phase hole, all the thin film transistors in the motor driving module are arranged close to the three-phase hole, and a ground wire electrically connected with the thin film transistors wraps a part of the PCB.

11. The electric pump according to claim 9, further comprising a sampling element and an integrated chip,
wherein a vertical projection of the sampling element on the PCB does not overlap with a vertical projection of the motor driving module on the PCB and a vertical projection of the integrated chip on the PCB;
in a direction perpendicular to the PCB, wires are provided at positions in the wiring film layer in the PCB corresponding to the thin film transistors, the integrated chip and the sampling element;
two ends of the sampling element are electrically connected with corresponding terminals of the integrated chip through two wires of the wiring film layer in the PCB respectively, and the two wires have equal diameters and lengths.

12. The electric pump according to claim 1, further comprising a motor driving module and an integrated chip,
wherein the PCB comprises two sides provided with electronic components, the motor driving module and the integrated chip are arranged at different sides of the PCB, and a vertical projection of the motor driving module on the PCB does not overlap with a vertical projection of the integrated chip on the PCB.

13. The electric pump according to claim 12, wherein a heat dissipation region is provided between the motor driving module and the integrated chip in a direction parallel to the PCB;
and in a direction parallel to the PCB, the integrated chip is arranged closer to a geometric center of the PCB than the motor driving module.

14. The electric pump according to claim 1, further comprising a motor driving module,
wherein the motor driving module comprises a plurality of thin film transistors arranged at a same side of the PCB; another side of the PCB that is provided with no thin film transistor is provided with a bare bonding pad corresponding to the thin film transistor; a vertical projection of the bonding pad on the PCB covers a vertical projection of the corresponding thin film transistor on the PCB, and a heat dissipation structure is provided on the bonding pad.

15. The electric pump according to claim 1, further comprising an integrated chip, wherein a bare bonding pad is provided on a side of the PCB that is provided with no integrated chip; a vertical projection of the bonding pad on the PCB covers a vertical projection of the corresponding integrated chip on the PCB, and a heat dissipation structure is provided on the bonding pad.

\* \* \* \* \*